CATHODE COMPENSATED ELECTRONIC TUBE CIRCUIT

Filed July 23, 1947 2 Sheets-Sheet 1

INVENTOR.
WILLIAM WEST MOE
BY
Campbell, Brumbaugh & Free
HIS ATTORNEYS.

April 17, 1951 W. W. MOE 2,548,901

CATHODE COMPENSATED ELECTRONIC TUBE CIRCUIT

Filed July 23, 1947 2 Sheets-Sheet 2

INVENTOR.
WILLIAM WEST MOE
BY
Campbell, Brumbaugh & Free
HIS ATTORNEYS.

Patented Apr. 17, 1951 2,548,901

UNITED STATES PATENT OFFICE 2,548,901

CATHODE COMPENSATED ELECTRONIC TUBE CIRCUIT

William West Moe, Stratford, Conn., assignor to Time, Inc., New York, N. Y., a corporation of New York Application July 23, 1947, Serial No. 763,049

5 Claims. (Cl. 332—52)

The present invention relates to electronic tube circuits. More specifically, it has to do with new and improved electronic tube circuits that are characterized by substantial linearity between input and output signals over relatively wide ranges.

In many electrical control systems utilizing electronic tube circuits, an accurately linear relationship between input and output signals is absolutely essential for proper operation. Electronic color correction apparatus, for example, requires electronic multiplying circuits that are accurate over a wide range of input values. The circuits available, heretofore, have not been entirely satisfactory because the converter or mixer type tubes employed do not have a sufficiently linear control characteristic over a wide enough output range to meet the requirements for this application.

The principal object of the invention, accordingly, is to provide new and improved electronic tube circuits in which a substantially linear relationship between output and input signals obtains over a relatively wide range.

Another object of the invention is to provide new and improved electronic tube circuits of the above character in which means are provided for compensating for non-linearity in the mutual conductance-control grid voltage characteristic of the tubes.

A further object of the invention is to provide new and improved electronic multiplying circuits that are characterized by substantial linearity over relatively wide ranges of inputs.

Still another object of the invention is to provide new and improved electronic amplifying circuits having good linearity characteristics over relatively wide input ranges.

Broadly speaking, the objects of the invention are attained by introducing into the circuit a non-linear element whose non-linear characteristics are chosen so as substantially to compensate for the non-linear characteristics of the electronic tube used. For example, the correction may be obtained by introducing a feedback signal from the output to the input side of an electronic tube circuit of proper magnitude and phase to correct for non-linearity of the circuit. More particularly, degenerative feedback is preferably employed and the feedback signal is developed across an impedance, the value of which varies as required to effect compensation for circuit non-linearity. Either current or voltage feedback may be employed, as desired.

In a representative embodiment, the feedback voltage is developed across a cathode resistor in the circuit of a conventional electronic tube, such as, for example, a converter tube having characteristics as shown in Figure 1. The resistance value of the cathode resistor remains substantially constant over the linear range of the circuit. Correction for non-linearity at control grid voltages near zero is made by connecting a non-linear impedance such as a thyrite resistor, for example, in parallel with the cathode resistor. Non-linear impedances of this type are characterized by a decreasing resistance as the terminal voltage increases. For this application, the characteristics of the non-linear impedance are selected so as to produce a decrease in the total cathode impedance in the upper range of non-linearity, which decrease is sufficient substantially to compensate for such non-linearity.

Non-linearity occurring in nearly all vacuum tubes with control grid voltages near cathode current cutoff may be corrected for, according to the invention, by shunting the cathode resistor by a circuit having a very high resistance over the linear range of the entire circuit, and a lower resistance when the terminal voltage drops below a threshold value. The shunting circuit may comprise, for example, a resistor in series with a biased rectifier which presents substantially an infinite impedance over the linear range of the entire circuit and a much lesser impedance for terminal voltages below the threshold value. By proper choice of resistor and bias, non-linearity of the circuit in the lower part of the range may be substantially corrected.

If the compensation is to be accomplished by voltage feedback, the feedback voltage may be developed in a voltage divider circuit including linear and non-linear impedances in series. The voltage divider is preferably connected between the plate of the tube and ground and the compensating voltage may be fed to the control grid of the tube through a D. C. blocking condenser. The characteristics of the voltage divider may be appropriately designed as indicated above to effect the desired compensation.

Additional objects and advantages of the invention will be apparent from the following detailed description of several representative embodiments, taken in conjunction with the accompanying drawings in which.

Figure 1:
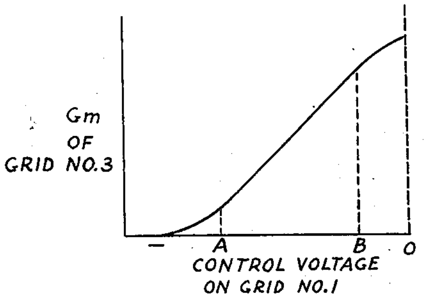
Figure 1 is a graph illustrating the mutual conductance-control grid voltage characteristic of a representative converter type tube.
Figure 2:
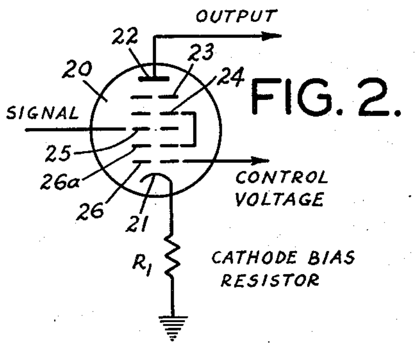
Figure 2 is a schematic diagram of a representative converter type tube circuit.

Referring now to Figure 2, a conventional type converter tube 20 is shown, having a cathode 21, a plate 22 and a plurality of grids 23, 24, 25, 26 and 26a. The tube 20 may be a standard type 6SA7 tube such as may be employed in frequency conversion circuits for radio receivers, for example. The $G_m$-control grid voltage characteristic for the control grid 25 is shown in Figure 1. As indicated by this curve, the relation between the $G_m$ and the control grid voltage is linear only over the range A—B and is non-linear both at the lower and the upper extremities of the range. A tube of this type has a linear control characteristic over an ouput range of only about 5 to 1.

Figure 4:
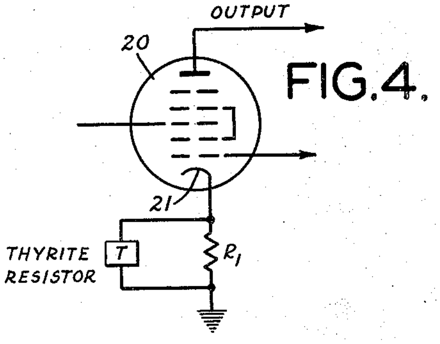
Figure 4 illustrates schematically an electronic tube circuit constructed according to the present invention for correcting non-linearity in the upper part of the range.

Figure 4 illustrates how the $G_m$-control grid voltage characteristic may be straightened at its upper end, in accordance with the invention. As shown in the figure, a cathode resistor $R_1$ is provided in series with the cathode 21 of the tube 20. Connected in parallel with the cathode resistor $R_1$ is a non-linear resistor T which may be a thyrite resistor, for example. Resistors of this type are characterized by a resistance value which is high with low terminal voltages and which decreases as the voltage is increased. The resistance of the thyrite resistor T and the resistor $R_1$ in parallel, thus, is substantially equal to $R_1$ for low voltages and for voltages up to a threshold value at which the resistance of the thyrite resistor T drops to a value comparable to the resistance of $R_1$. Above this threshold voltage, the resistance of the parallel combination decreases as the voltage is increased.

Figure 3:
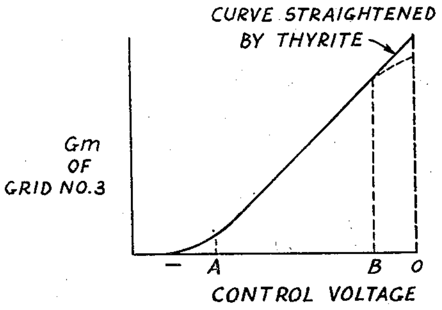
Figure 3 is a graph of the mutual conductance-control grid voltage characteristic of the tube circuit illustrated in Figure 4.

In the circuit shown in Figure 4, a thyrite resistor T is chosen which has little effect on the cathode circuit resistance at cathode voltages up to a value corresponding to the upper end B of the linear portion of the curve shown in Figure 3. From that point on, the resistance of the resistor T decreases sufficiently to decrease the total cathode impedance and to decrease the amount of degeneration in the control grid circuit of the tube 20. For proper values of the resistor $R_1$ and the thyrite resistor T, the upper end of $G_m$-control grid voltage characteristic may be straightened, as shown in Figure 3.

Figure 6:
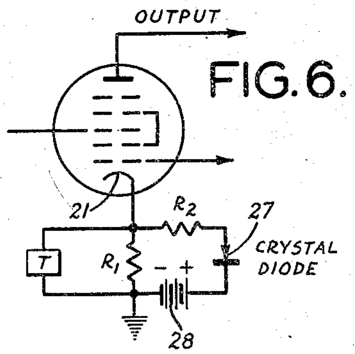
Figure 6 is a schematic diagram of a further modification of the circuit shown in Figure 4 which affords correction at both the lower and upper regions of the range.

The lower end of the $G_m$-control grid voltage characteristic may be straightened by means of the circuit illustrated schematically in Figure 6. As shown in that figure, a second circuit element is connected in shunt with the resistor $R_1$ which comprises, for example, a linear resistor $R_2$, and a conventional crystal diode rectifier 27 whose anode is connected to the positive terminal of a source of biasing voltage 28. Any other suitable rectifying device, such as a vacuum tube diode, could, of course, be substituted for the crystal diode 27, if desired.

Figure 5:
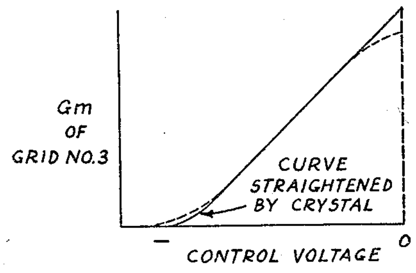
Figure 5 is a representation of the mutual conductance-control grid voltage characteristic of the tube circuit shown in Figure 6.

With the circuit shown in Figure 6, the resistor $R_2$, the rectifier 27 and the battery 28 represent a substantially infinite impedance until the voltage across the resistor $R_1$ drops to the value corresponding to the lower end A of the linear range of the $G_m$-control grid voltage characteristic shown in Figure 5. As the control grid drops below that threshold value, the rectifier 27 begins to conduct and connects the resistor $R_2$ in parallel with the cathode resistor $R_1$. This reduces the total impedance in the circuit of the cathode 21, producing a corresponding reduction in degeneration. In this fashion, the lower part of the $G_m$-control grid voltage characteristic is straightened somewhat, as indicated on the curve shown in Figure 5. Further straightening of the curve may be accomplished by adding other suitably designed shunt rectifier circuits.

Figure 7:
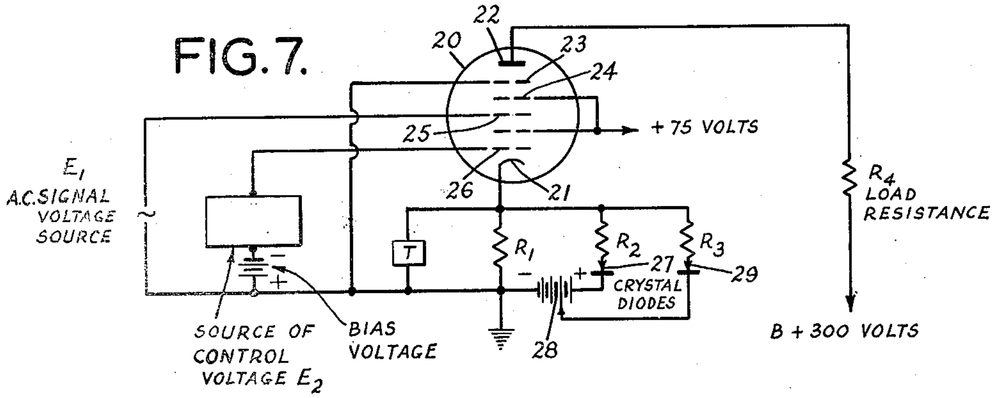
Figure 7 is a schematic diagram of a linear multiplier circuit constructed according to the invention.

Figure 7 illustrates a representative multiplier circuit having a linear relationship between output and input over a wide range, in accordance with the invention. As shown in the figure, this circuit receives input voltages $E_1$ and $E_2$ and is adapted to provide an output which is defined by the equation:

A. C. output current$=K_1 \times E_1 \times E_2$ where $E_1$ is an A. C. voltage of low maximum value and $E_2$ is the D. C. control voltage.

To this end, the signal voltage $E_1$ is supplied to the third control grid electrode 25 of the converter tube 20 while the voltage $E_1$ is impressed upon the first control grid electrode 26. Connected in parallel with the cathode resistor $R_1$ is a thyrite resistor T and a pair of parallel circuits comprising the linear resistors $R_2$ and $R_3$, the crystal diode rectifiers 27 and 29 and a source of biasing voltage 28.

In a representative circuit, the tube 20 was a conventional type 6SA7 and the constants of the degenerative feedback circuit were as follows:

T=GE thyrite resistor, Dwg. No. 8,396,839, Gr. 1
$R_1$=3300 ohms
$R_2$=390 ohms
$R_3$=4700 ohms The crystal diode rectifiers 27 and 29 were of conventional germanium type. The voltage supplied by the biasing battery 28 to the circuit including the resistor $R_2$ was 2 volts and to the circuit including resistor $R_3$ was 3 volts.

Figure 8:
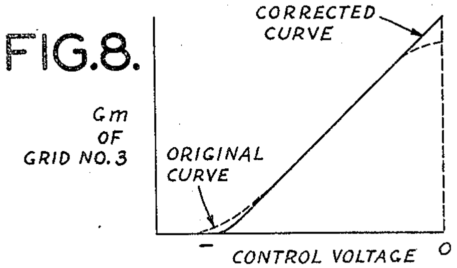
Figure 8 represents the mutual conductance-control grid voltage characteristic of the tube in the circuit of Figure 7.

The curve of the $G_m$-control grid voltage characteristic of the tube shown in Figure 7 is illustrated in Figure 8. As indicated, the thyrite resistor T serves to correct the non-linearity at the upper extremity of the curve while the rectifier circuits including the resistors $R_2$ and $R_3$ compensate for non-linearity in the lower part of the range. With a circuit of this type, substantial linearity can be obtained over a control range of about 50 to 1, which is a very substantial improvement over the conventional circuit shown in Figure 2.

Figure 9:
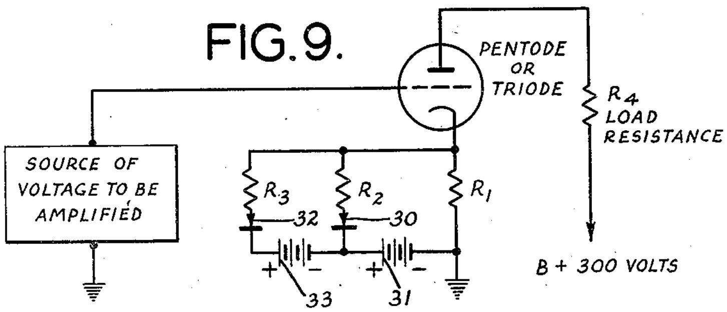
Figure 9 illustrates schematically a triode amplifier circuit constructed according to the invention.

In Figure 9 is shown a conventional amplifier circuit utilizing current degeneration, according to the invention, to obtain linearity over a relatively wide range. Most amplifier tubes that are available have a rising $G_m$-control grid characteristic at higher currents so that it is generally not necessary to provide compensation in this part of the range. However, there is always some non-linearity in the lower part of the range which may be greatly reduced by means of one or more biased rectifier circuits connected in parallel with the cathode resistor $R_1$, as shown in the figure. One of the rectifier circuits may comprise the linear resistor $R_2$, the crystal diode rectifier 30 and the battery 31 while the second circuit may comprise the resistor $R_3$, the rectifier 32 and the biasing battery 33.

While a triode amplifier circuit has been shown in Figure 9, it will be understood that compensation may be effected in the same manner in a pentode amplifier. In such case, the connections will be the same except that voltages will be supplied for the screen grid electrodes of the pentodes employed.

Figures 10, 11:
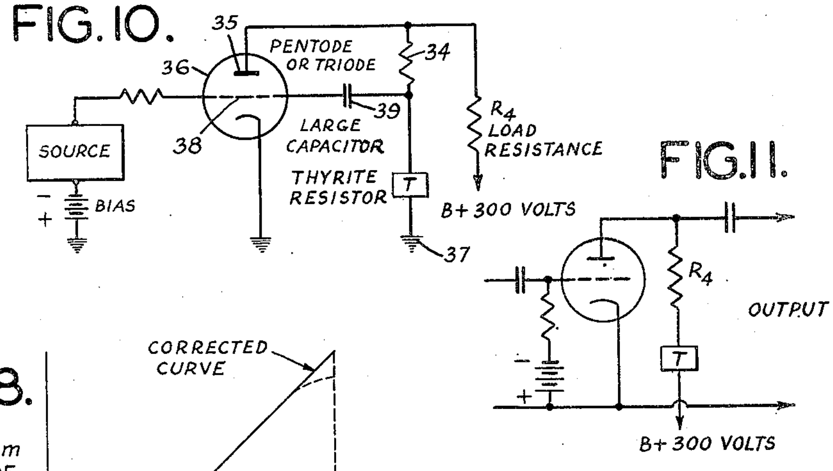
Figure 10 is a modification of the circuit shown in Figure 9 in which voltage feedback is employed.
Figure 11 illustrates schematically how the invention may be applied to the plate circuit of a conventional vacuum tube amplifier.

Instead of using current degeneration, as shown in Figure 9, compensation for non-linearity in an amplifier circuit may be effected by means of voltage degeneration, as shown in Figure 10. Where this is done, the compensating voltage is preferably developed across a voltage divider comprising a thyrite resistor T and a linear resistor 34 in series, the voltage divider circuit being connected to the plate 35 of the tube 36 and to ground 37, as shown. The voltage appearing across the thyrite resistor T is impressed upon the control grid electrode 38 of the tube 36 through a D. C. blocking condenser 39.

In the Figure 10 embodiment, until the threshold voltage is reached, the resistance of the thyrite resistor T is very much higher than the resistance of the resistor 34 so that a fixed fraction of the output voltage is fed back degeneratively into the control grid circuit of the tube 36. As the output voltage increases above the threshold value, the resistance of the thyrite resistor T decreases so that the feedback voltage decreases. In this manner the lower part of the $G_m$-control grid voltage characteristic is straightened to increase the range of linearity.

In Figure 11, a thyrite resistor T is connected in series with the load resistance $R_4$ in a triode or pentode voltage amplifier circuit to reduce the normal distortion. As the grid of the tube is made more negative, the plate current of the tube decreases and the resistance of the thyrite resistor T increases, thus straightening the curve of plate voltage versus grid voltage for the tube.

From the foregoing, it will be apparent that the invention provides highly effective electronic tube circuits that are characterized by substantial linearity over very wide ranges of input values. By utilizing a combination of linear and non-linear resistances in feedback circuits, or in other circuit combinations, non-linear portions of the $G_m$-control grid voltage characteristic of the tubes may be effectively straightened, thus increasing the range of linearity and affording a wider usable range than has been available heretofore.

While several embodiments have been described herein, the invention is not intended to be restricted thereto but is susceptible of numerous changes in form and detail within the scope of the appended claims.

I claim:

1. In combination with an electron tube having plate, grid and cathode electrodes and a cathode resistor, at least one non-linear resistor connected in parallel with said cathode resistor, and at least one resistor and one biased unilaterally conducting device in series connected in parallel with said cathode resistor.

2. In a modulation system including an electron tube having plate and cathode electrodes and a plurality of grid electrodes, the combination of means supplying one signal to one of said grid electrodes, means supplying a second signal to another of said grid electrodes, a cathode resistor connected in series with said cathode electrode, and a non-linear resistor connected in parallel with said cathode resistor, said non-linear resistor being designed to decrease the degenerative effect of said cathode resistor at input magnitudes which produce voltages near zero on one of said grid electrodes to compensate for non-linearity of the $G_m$-grid voltage characteristic of said tube at said input magnitudes.

3. In modulation systems including an electron tube having plate and cathode electrodes and a plurality of grid electrodes, the combination of means supplying one signal to one of said grid electrodes, means supplying a second signal to another of said grid electrodes, a cathode resistor connected in series with said cathode electrode, and at least one circuit including a linear resistor and a biased unilaterally conducting device in series connected in parallel with said cathode resistor, said linear resistor and unilaterally conducting device being designed to decrease the degenerative effect of said cathode resistor input magnitudes which produce voltages near cathode current cutoff on one of said electrodes to compensate for non-linearity of the $G_m$-grid voltage characteristic of said tube at said input magnitudes.

4. In a modulation system including an electron tube having plate and cathode electrodes and a plurality of grid electrodes, the combination of means supplying one signal to one of said grid electrodes, means supplying a second signal to another of said grid electrodes, a cathode resistor connected in series with said cathode electrode, a non-linear resistor connected in parallel with said cathode resistor, said non-linear resistor being designed to decrease the degenerative effect of said cathode resistor at input magnitudes which produce voltages near zero on one of said grid electrodes to compensate for non-linearity of the $G_m$-grid voltage characteristic of said tube at said input magnitudes, and at least one circuit including a linear resistor and a biased unilaterally conducting device in series connected in parallel with said cathode resistor, said linear resistor and unilaterally conducting device being designed to decrease the degenerative effect of said cathode resistor at input magnitudes which produce voltages near cathode current cutoff on one of said grid electrodes to compensate for non-linearity of the $G_m$-grid voltage characteristic of said tube at said input magnitudes.

5. In amplifier apparatus including an electron tube having plate, grid and cathode electrodes and a cathode resistor, the combination of at least one compensating circuit connected in parallel with said cathode resistor and comprising a resistor and a biased unilaterally conducting device in series, said compensating circuit being designed to reduce the degenerative effect of said cathode resistor at input magnitudes which produce voltages near cathode current cutoff on the grid electrode of said tube, to compensate for non-linearity in the $G_m$-control grid voltage characteristic of the tube at said input magnitudes.

WILLIAM WEST MOE.

REFERENCES CITED

The following references are of record in the file of this patent:

UNITED STATES PATENTS

| Number | Name | Date |
|---|---|---|
| 2,017,192 | Wolff | Oct. 15, 1935 |
| 2,032,199 | Braden | Feb. 25, 1936 |
| 2,151,829 | Barton | Mar. 28, 1939 |
| 2,215,777 | Benz | Sept. 24, 1940 |
| 2,222,933 | Blumlein | Nov. 26, 1940 |
| 2,231,542 | Mallinckrodt | Feb. 11, 1941 |
| 2,369,030 | Edwards | Feb. 6, 1945 |